United States Patent [19]
Mikoshiba et al.

[11] Patent Number: 5,803,974
[45] Date of Patent: Sep. 8, 1998

[54] CHEMICAL VAPOR DEPOSITION APPARATUS

[75] Inventors: Nobuo Mikoshiba; Tadahiro Ohmi; Kazuo Tsubouchi; Kazuya Masu; Nobumasa Suzuki, all of Sendai, Japan

[73] Assignee: Canon Kabushiki Kaisha, Tokyo, Japan

[21] Appl. No.: 479,857

[22] Filed: Jun. 7, 1995

Related U.S. Application Data

[63] Continuation of Ser. No. 354,055, Dec. 6, 1994, abandoned, which is a continuation of Ser. No. 209,377, Mar. 14, 1994, abandoned, which is a continuation of Ser. No. 50,986, Apr. 22, 1993, abandoned, which is a continuation of Ser. No. 846,775, Mar. 9, 1992, abandoned, which is a continuation of Ser. No. 666,456, Mar. 5, 1991, abandoned, which is a continuation of Ser. No. 456,056, Dec. 26, 1989, abandoned, which is a continuation of Ser. No. 310,021, Feb. 9, 1989, abandoned, which is a continuation of Ser. No. 125,826, Nov. 25, 1987, abandoned, which is a continuation of Ser. No. 911,415, Sep. 25, 1986, abandoned.

[51] Int. Cl.⁶ .................................................. C23C 16/00
[52] U.S. Cl. ................................. 118/723 MP; 118/722; 118/723 IR
[58] Field of Search ............................. 118/722, 723 MP, 118/723 MW, 723 ME, 723 MR, 723 MA, 723 AN, 723 E, 723 ER, 723 I, 723 IR, 719; 156/345, 626, 627

[56] References Cited

U.S. PATENT DOCUMENTS

| | | | |
|---|---|---|---|
| Re. 31,708 | 10/1984 | Gordon | 427/126.2 |
| 3,473,978 | 10/1969 | Jackson et al. | 148/175 |
| 3,888,705 | 6/1975 | Fletcher et al. | 148/175 |
| 4,141,780 | 2/1979 | Kleinknecht | 156/626 |
| 4,146,657 | 3/1979 | Gordon | 427/126 |
| 4,239,811 | 12/1980 | Kemlage | 427/95 |
| 4,340,617 | 7/1982 | Deutsch et al. | 437/169 |
| 4,357,179 | 11/1982 | Adams et al. | 148/1.5 |
| 4,402,762 | 9/1983 | John et al. | 148/1.5 |
| 4,421,592 | 12/1983 | Shaskus et al. | 156/613 |

(List continued on next page.)

FOREIGN PATENT DOCUMENTS

| | | |
|---|---|---|
| 74212 | 3/1983 | European Pat. Off. |
| 90586A | 10/1983 | European Pat. Off. |
| 59-199035 | 12/1984 | Japan . |
| 60-43819 | 8/1985 | Japan . |
| 60-180999 | 9/1985 | Japan . |
| 61-84379 | 4/1986 | Japan . |
| 2038086 | 7/1980 | United Kingdom . |
| 2148328 | 5/1985 | United Kingdom . |

OTHER PUBLICATIONS

Ohnishi et al., Proceedings, 6th E.C. Photovoltaic Solar Energy Conference, London, Apr. 15–19, 1985.
Sakai et al., Proceedings, 6th E.C. Photovoltaic Solar Energy Conference, London, Apr. 15–19, 1985.
Brodsky et al., 22 IBM Technical Disclosure Bulletin 3391 (Jan. 1980).
Inoue, Appl. Phys. Lett. 43(8), 15 Oct. 83, p. 774.

*Primary Examiner*—John Niebling
*Assistant Examiner*—Joni Y. Chang
*Attorney, Agent, or Firm*—Fitzpatrick, Cella, Harper & Scinto

[57] ABSTRACT

A process for forming a deposited film on a substrate according to the chemical vapor deposition method comprises previously forming excited species of a gas phase compound containing atoms which become constituents constituting said deposited film, supplying the excited species onto the surface of said substrate and effecting photoirradiation on said substrate surface, thereby forming the deposited film through the surface reaction.

10 Claims, 7 Drawing Sheets

U.S. PATENT DOCUMENTS

| | | | |
|---|---|---|---|
| 4,448,801 | 5/1984 | Fukuda et al. | 427/39 |
| 4,462,847 | 7/1984 | Thompson et al. | 148/174 |
| 4,493,745 | 1/1985 | Chen | 156/626 |
| 4,504,518 | 3/1985 | Ovshinsky et al. | 427/38 |
| 4,522,663 | 6/1985 | Ovshinsky et al. | 148/403 |
| 4,532,199 | 7/1985 | Ueno et al. | 430/128 |
| 4,554,180 | 11/1985 | Hirooka | 427/248.1 |
| 4,579,623 | 4/1986 | Suzuki | 156/626 |
| 4,615,761 | 10/1986 | Tada | 156/626 |
| 4,615,905 | 10/1986 | Ovshinsky | 427/39 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/87 |
| 4,652,463 | 3/1987 | Peters | 427/53.1 |
| 4,657,620 | 4/1987 | Davis | 156/345 |
| 4,657,777 | 4/1987 | Hirooka | 427/39 |
| 4,659,413 | 4/1987 | Davis et al. | 156/345 |
| 4,668,337 | 5/1987 | Sekine et al. | 156/643 |
| 4,689,093 | 8/1987 | Ishihara et al. | 437/5 |
| 4,700,311 | 10/1987 | Tributsch | 364/468 |
| 5,280,983 | 1/1994 | Maydan et al. | 294/119.1 |

CHEMICAL VAPOR DEPOSITION APPARATUS

This application is a continuation of application Ser. No. 08/354,055 filed Dec. 6, 1994, now abandoned, which is a continuation of application Ser. No. 08/209,377 filed Mar. 14, 1994, now abandoned, which is a continuation of application Ser. No. 08/050,986, filed Apr. 22, 1993, now abandoned, which is a continuation of application Ser. No. 07/846,775, filed Mar. 9, 1992, now abandoned, which was a continuation of application Ser. No. 07/666,456 filed Mar. 5, 1991, now abandoned, which is a continuation of application Ser. No. 07/456,056 filed Dec. 26, 1989, now abandoned, which is a continuation of application Ser. No. 07/310,021 filed Feb. 9, 1989, now abandoned, which is a continuation of application Ser. No. 07/125,826 filed Nov. 25, 1987, now abandoned, which is a continuation of application Ser. No. 06/911,415 filed Sep. 25, 1986, now abandoned.

BACKGROUND OF THE INVENTION

1. Field of the Invention

This invention relates to a process for forming a deposited film according to the chemical vapor deposition method and a device to be used therefor.

2. Related Background Art

For example, in preparation of electronic devices or integrated circuits by use of semiconductors, a large number of steps are required for successively forming deposited films such as single crystalline thin films, polycrystalline thin films, amorphous thin films, insulating thin films, metal thin films, etc., on a substrate such as of silicon or gallium arsenide, etc. As a thin film forming method to be used for such a semiconductor process, there is the chemical vapor deposition method (hereinafter called CVD method).

As to the CVD method of the prior art, there is known the thermal CVD method, the plasma CVD method and the photo CVD method, which have been practically applied under their respective suitable conditions, partly because they are excellent in deposited film formability at the portion having a stepped difference, namely stepped difference coatability, as compared with the physical vapor deposition method (PVD method) such as vacuum vapor deposition, etc.

Among them, the thermal CVD method is a method in which the chemical reaction of the starting gas molecules is caused to occur externally heating the reaction vessel in which the substrate is placed or by heating the stand on which the substrate is placed. Since the chemical reaction is caused generally only by heat, there is involved the drawback that the substrate temperature must be elevated to a high temperature. Also, for the purpose of causing the chemical reaction to occur on the substrate surface, the reaction vessel pressure, the starting gas flow rate, etc., are optimized, but the gas phase decomposition of the starting gas caused by the heat from the substrate cannot be avoided and it is difficult to obtain a film of desired good quality by only the surface reaction by avoiding such reactions in gas phase. It is also impossible to carry out the gas phase reaction and the surface reaction while controlling these reactions, respectively.

As one of the methods for forming deposited films at a low substrate temperature, there is the plasma CVD method. With ordinary plasma CVD method, since the plasma atmosphere is in contact with the substrate, the charged particles in the plasma (ionized starting gas molecules, and electrons) for causing decomposition or ionization of the starting gas molecules reach the substrate surface, and play a role in promoting the chemical reaction on the substrate surface, etc. However, since the charged particles reach the substrate, the substrate is damaged by the charged particles. Accordingly, it may be conceivable to reduce the charged particle damage onto the substrate by reducing the plasma power, but, in this case, the starting gas decomposed in the gas phase will be deposited as fallen particles on the substrate, whereby no dense deposited film can be formed.

It is also impossible to control individually and separately the decomposition reaction in the gas phase and the surface reaction.

Another method for forming a deposited film at a lower substrate temperature is the photo CVD method. Among the photo CVD methods, there is the method which is called the mercury sensitization method. According to this method, first the starting gas is mixed with mercury and introduced into the reaction vessel. Next, when a light such as of a mercury lamp, etc., is irradiated on the starting gas mixed with the mercury, the mercury atoms are transitioned to excited state. The excited mercury atoms give an energy to the starting gas molecules, whereby the starting gas molecules are decomposed and further reach the substrate to form a deposited film thereon. However, since the decomposed starting gas molecules reach the substrate as fallen particles, there is the drawback that it is difficult to form a dense film.

Thus, according to the mercury sensitization method, a dense and good quality deposited film can be formed with difficulty, because only gas phase decomposition of the starting gas molecules is effected by utilizing mercury atoms and a light from a mercury lamp for decomposition of the starting gas molecules in the gas phase, etc.

Also, among the photo CVD methods, there is the method in which a deposited film is formed by irradiating the light with the wavelength corresponding to the absorption band in the UV-region or IR-region of the starting gas. However, this method also merely decomposes the starting gas in the gas phase, and the decomposed starting gas molecules reach the substrate as fallen particles thereon, whereby it is difficult to form a dense deposited film. Also, when internal pressure of the reaction vessel is reduced, the starting gas molecule concentration becomes dilute and therefore it is difficult for light to be absorbed, thereby lowering the efficiency of decomposition of the starting gas molecules in gas phase. Accordingly, this method involves a substantial drawback even as the exciting means in the CVD method under reduced pressure.

Further, different from these photo CVD method, there is the method in which the reaction on the substrate surface is promoted by irradiation of a light on the substrate, but this method has the drawback that the speed for formation of a deposited film is slow, because the starting gas molecules reach the substrate surface as such.

SUMMARY OF THE INVENTION

An object of the present invention is to solve the problems of the prior art and provide a method for forming a deposited film which is capable of forming a dense and good quality deposited film at a relatively low substrate temperature and yet while maintaining a practical deposited film forming speed without inflicting the damage caused by charged particles, etc., and a device which can be used therefor.

Another object of the present invention is to provide a process for forming a deposited film on a substrate according to the chemical vapor deposition method, which comprises previously forming excited species of a gas phase compound containing atoms which become constituent elements of the deposited film, supplying the excited species onto the surface of the substrate and effecting photoirradiation on the substrate surface, thereby forming the deposited film through the surface reaction.

Still another object of the present invention is to provide a device for forming a deposited film which forms a deposited film on a substrate according to the chemical vapor deposition method, comprising an exciting energy supplying means for forming excited species of a gas phase compound containing the atoms which become constituent elements of the deposited film on the supplying route for supplying the gas phase compound to the substrate in a deposition chamber, and a photoirradiation system for effecting photoirradiation on the substrate in the deposition chamber, thereby effecting photoirradiation on the substrate surface so as to form a deposited film through the surface reaction of the excited species.

DESCRIPTION OF THE PREFERRED EMBODIMENTS

Figure 1A:
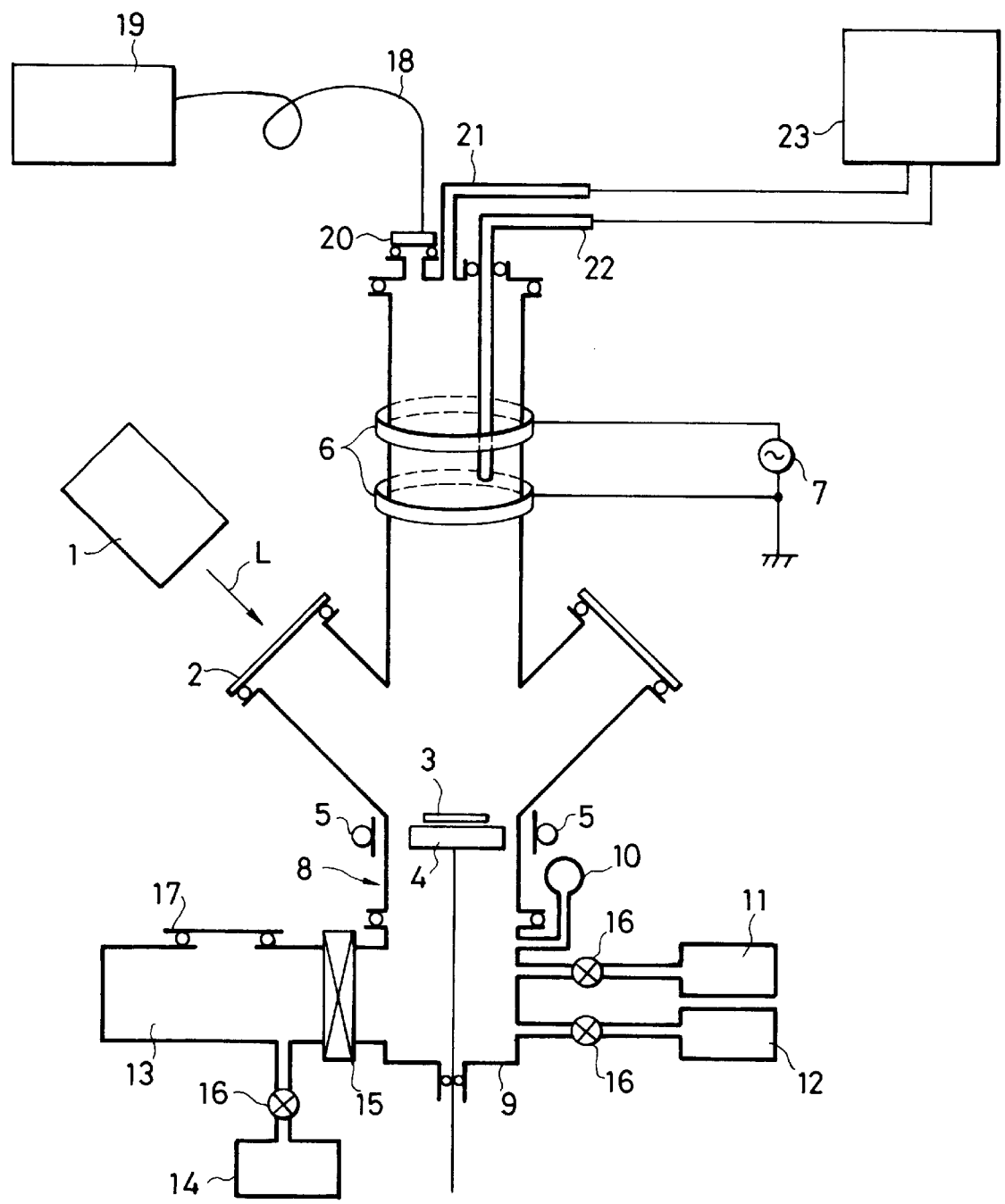
FIG. 1A illustrates schematically one example of the device of the present invention.

The process for forming a deposited film of the present invention is a process for forming a deposited film on a substrate according to the chemical vapor deposition method, which comprises forming previously excited species of a gas phase compound containing atoms which become constituent elements of the deposited film, supplying the excited species onto the surface of the substrate and effecting photoirradiation on the substrate surface, thereby forming the deposited film through the surface reaction.

In the present invention, the above excited species of a gas phase compound refers to active species, ion species, radical species, etc., formed by excitation, ionization, incomplete decomposition reaction, etc., of the gas phase compound, and the excited species consisting only of the atoms which become the constituent elements of the above deposited film are excluded.

For example, to take the example of trimethyl aluminum (chemical formula $Al_2(CH_3)_6$, hereinafter written as "TMAl") which is one of alkyl metal compounds as the gas phase compound, this compound is excited, ionized, incompletely decomposed, etc., as shown below to form excited species.

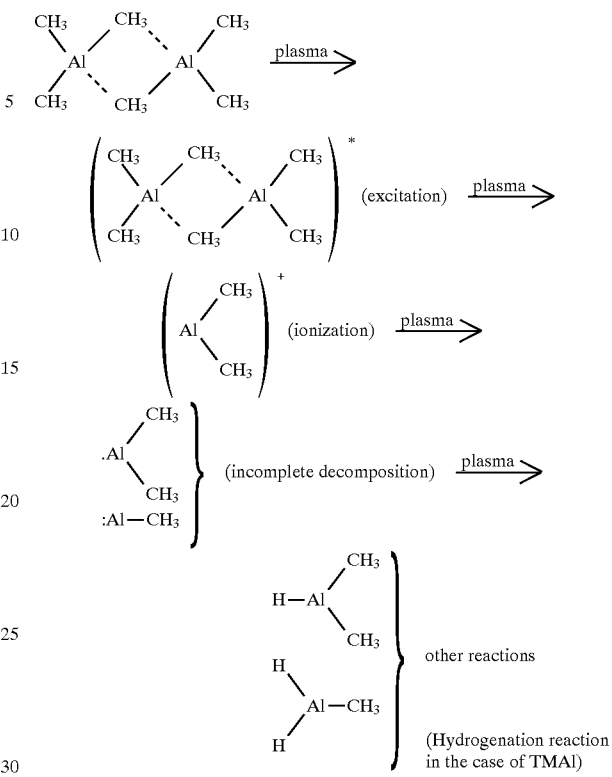

Examples of the energy to be used for formation of excited species from the above gas phase compound may include photoenergy, electrical energy, and heat energy.

Examples of photoenergy may include excimer lasers such as rare gas excimer laser ($Xe_2$, $Kr_2$, $Ar_2$), rare gas-oxygen excimer laser (XeO, KrO, ArO), mercury halide excimer laser (HgCl), rare gas halide excimer laser (XeF, XeCl, KrF, ArF, $Xe_2Cl$, $Kr_2F$), halide excimer laser ($F_2$), etc.; and photoenergizes may include use of a low pressure mercury lamp (Hg/rare gas), low pressure metal vapor lamp (Cd, Zn/rare gas), high pressure mercury lamp (Hg/rare gas), ultra-high pressure mercury lamp (Hg/ rare gas), Deep-UV lamp (Hg/He), xenon lamp (Xe), rare gas resonance ray lamp (Ar, Kr, Xe), rare gas molecular emission lamp ($Ar_2$, $Kr_2$, $Xe_2$), mercury lamp ($H_2$, $D_2$), etc.

Electrical energy may be, for example, those of respective glow discharging, of RF, AC, DC, are discharging, microwave excitation (2.45 GHz).

For improvement of film thickness uniformity and film quality uniformity of the deposited film and improvement of stepped difference coatability, the space in which the substrate is placed should desirably be brought to a reduced pressure of about $10^{-3}$ to $10^{-5}$ Torr, and it is therefore desirable to use electrical energy which can be controlled relatively easily the formation reaction of excited species under reduced pressure by control of output, irrespective of the gas phase compound employed.

The light with wavelength which does not cause a photochemical reaction or a localized heat-generating effect on the substrate surface will only unnecessarily heat the substrate, and therefore it is preferable to promote the surface reaction on the substrate surface by selecting the wavelength of the light to be irradiated on the substrate surface.

Similarly as the original gas phase compound absorbs the light within a specific wavelength region, the wavelength region of light for causing a photochemical reaction such as the cleavage of bonds exists as a matter of course for the above excited species adsorbed on the substrate surface.

Photochemical reactions such as cleavage of bonds of excited species adsorbed on the substrate surface will frequently occur in the longer wavelength region rather than the absorption wavelength region of the original gas phase compound.

The wavelength region of the light for causing cleavage of bonds between atoms becomes the UV-wavelength region.

For causing the surface reaction to occur by local heat-generation, the light to be irradiated on the substrate surface should preferably be absorbed in the vicinity of the substrate surface. For permitting the light to be absorbed in the vicinity of the substrate surface, the wavelength should be preferably within UV wavelength region for the substrate to be used in conventional semiconductors. With UV-light in the wavelength region deviated from the absorption maximum wavelength region of the gas phase compound, local heat generation can be effected to cause the surface reaction to occur without decomposition of the gas phase compound in gas phase.

The method for irradiating light to promote the reaction on the substrate surface may be conducted by use of either continuous light or intermittent light with greater peak power for the purpose of making the local heat generation effect greater, and it is desirable to promote the surface reaction on the substrate surface by varying the intensity of the light irradiated on the substrate surface with time.

Also, the film thickness of the deposited film formed can be controlled by spatially controlling the intensity of light irradiated onto the substrate surface. By doing so, for example, by selecting the shape of the irradiated light beam and controlling adequately its output, deposited films with respective different film thicknesses can be formed at the different sites on the substrate surface. The process of the present invention can be utilized for formation of virtually all kinds of deposited films, typically single crystalline thin film, polycrystalline thin film, amorphous thin film, insulator thin film, metal thin film, etc., on the substrate such as of silicon, gallium arsenide, etc., during production of electronic devices or integrated circuits by use of semiconductors as described above and, corresponding thereto, at least one kind of the above gas phase compounds can be used depending on the kind of the deposited film formed. Also, the substrate can be suitably selected and used.

The present invention is described in more detail by referring to the accompanying drawings. In FIGS. 1–7, L represents light flex.

FIG. 1A is a schematic illustration showing one example of the device of the present invention when one kind of the above gas phase compound is used as the starting material.

1 is a photoirradiation system for irradiating light on the substrate.

2 is a light transmitting window for transmitting light of the necessary wavelength region. The light transmitting window is constituted of materials such as molten quartz, synthetic quartz, sapphire, magnesium fluoride, lithium fluoride, calcium fluoride, barium fluoride, etc. In the process of the present invention, the wavelength of the light irradiated on the substrate surface is longer than 200 nm in many cases, and the light transmitting window should desirably be made of synthetic quartz for easiness in handling. For prevention of fog, a gas such as $H_2$, He, Ar, $N_2$, etc., may be blown against the light transmitting window.

3 is a substrate which is generally a semiconductor wafer such as silicon, gallium, arsenide, etc. However, the substrate is not limited to a semiconductor wafer, but it may be glass, metal, etc.

4 is a substrate supporting stand and, as shown in this embodiment, when the substrate is heated by high frequency induction heating from outside, it is a block of a material such as carbon, or carbon coated with SiC, or a metal such as molybdenum. For easiness in handling, it is preferable to use carbon coated with SiC in this embodiment.

In the embodiment of FIG. 1A, a substrate heating high frequency coil 5 mounted at the outside of the reaction vessel 8 is used for the heating of the substrate, and electrodes 6 for plasma generation mounted at the outside of the reaction vessel 8 are used for plasma generation. Thus, coil 5 for substrate heating and electrodes 6 for plasma generation may be supported from the outside, whereby the reaction vessel 8 can be worked with ease.

The reaction vessel 8 can be easily manufactured of a glass such as quartz, etc. Also, when the reaction vessel 8 is made of quartz, etc., there is the advantage that the reaction vessel 8 can be wholly washed with the use of a solution such as acid, etc.

Further, when the reaction vessel 8 is manufactured of synthetic quartz, even if the light irradiated on the substrate may have shorter wavelength than 200 nm, there is the advantage that the window for light incidence 2 is not required to be specifically provided.

5 is a high frequency coil for heating substrate, and is mounted at the outer circumference of the reaction vessel 8. The substrate is heated by high frequency induction heating.

6 are electrodes for plasma generation. When using high frequencies of about 13.6 MHz, electrodes are required and, in the embodiment of FIG. 1A, a plural number of electrodes of exciting electrodes and ground electrodes are mounted so as to surround the outer portion of the reaction vessel 8. In the embodiment of FIG. 1A, plasma generating electrodes are provided at the outside of the reaction vessel, but electrodes may be provided internally of the reactor.

7 is a high frequency power source for plasma generation. In the embodiment of FIG. 1A, the frequency can be made a practical frequency of about 13.6 MHz.

8 is a reaction vessel. In the embodiment of FIG. 1A, induction heating system with a high frequency coil 5 mounted at the outside of the reaction vessel is used for heating substrate and therefore the reaction vessel material should desirably be made of an insulating material such as quartz, etc.

In the embodiment of FIG. 1A, the reaction vessel has a single tubular structure of quartz. Quartz may be formed into a double tubular structure to give a reaction vessel with a structure which is cooled with water.

10 is a pressure gauge for monitoring the pressure within the reaction vessel 8 during deposition. A diaphragm system absolute pressure vacuum gauge is employed, which will not change in indication value regardless of the kind of the gas within the reaction vessel 8.

11 is an evacuation system, which is constructed of a mechanical booster pump and a rotary pump connected in series. The construction of the evacuation system is not limited to the above constitution provided that there is a function with maintain the pressure in the reaction vessel 8 at a desired level when a diluting gas and a gas phase compound are fed into the reaction chamber at predetermined flow rates from the starting gas feeding system 23 during formation of a deposited film.

12 is a high vacuum evacuation system which can evacuate the reaction vessel internally to a high vacuum of approximately $10^{-6}$ to $10^{-8}$ Torr. Before and after formation of a deposited film, the reaction vessel 8 is internally evacuated to high vacuum to reduce residual impurity gases. It is constructed of a turbo molecular pump and a rotary pump connected in series. If there is a pump which can evacuate internally the reaction vessel to approximately $10^{-6}$ to $10^{-8}$ Torr, the constitution of the high vacuum evacuation system is not limited to the above construction.

13 is a preliminary chamber for substrate charge. It has a mechanism for conveying the substrate 3 delivered through the substrate gateway 17 into the preliminary chamber for substrate charge 13 and into the reaction chamber 8.

14 is an evacuation system for evacuating the preliminary chamber for substrate charge 13 to vacuum.

15 is a gate valve for separating the preliminary chamber for substrate charge 13 from the chamber 9 which supports the reaction vessel 8.

16 is a valve.

17 is a gateway for substrate.

In the embodiment of FIG. 1A, a preliminary chamber for substrate charge 13 is provided so that the reaction chamber 8 is not be internally contaminated by contact with air containing oxygen, etc.

18 is an optical fiber. It leads light by plasma emission to a plasma emission spectrum measuring system 19.

19 is a plasma emission spectrum measuring system. This is used for measuring the plasma emission spectrum in order to determine its the power during gas phase excitation of the starting gas. It is also a monitor for observing whether plasma is generated under the same state for every time.

As a means for observing the state of plasma, there is, for example, the method in which the gas formed in the reaction chamber 8 is qualitatively analyzed by means of a quadrupole mass analyzer. Other than the plasma emission spectrum measuring system, the above quadrupole mass analyzer, etc., may be also used for observing the plasma state.

20 is a window for observing the plasma emission spectrum. It may be made of any material which can transmit the emitted light. In the embodiment of FIG. 1A, synthetic quartz is used.

21 is a gas inlet which introduces a gas such as $H_2$, Ar, He or $N_2$ (hereinafter called diluting gas) at a predetermined flow rate from the starting gas feeding system.

Other gases than diluting gas may also be introduced.

22 is a starting gas introducing inlet which introduces a gas phase compound desired to be excited in gas phase in the plasma generating region as well as diluting gas from the starting gas feeding system 23.

23 is a starting gas feeding system, which is a system for feeding diluting gas and a gas phase compound at predetermined flow rates and predetermined pressures through the gas introducing inlet 21 and the starting gas introducing inlet 22 into the reaction chamber 8.

Figure 1B:
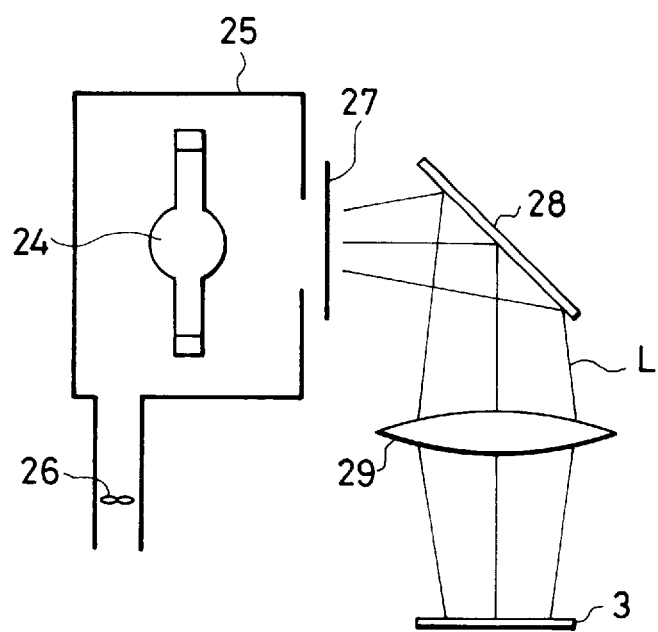
FIG. 1B illustrates schematically an example of the photoirradiation system to be used therefor.

FIG. 1B is a schematic illustration showing a example of the photoirradiation system 1 shown in FIG. 1A. The photoirradiation system is not limited to the construction of FIG. 1B, provided that it is a device capable of irradiating the light in the desired wavelength region at a desired intensity and a desired shape on the substrate surface. In the embodiment of FIG. 1B, a part of the emission spectrum from the lamp 24 is reflected from a multi-layer dielectric mirror 28 to irradiate the light onto the substrate 3. Light is irradiated over substantially the whole region of the substrate 3. As a means for selecting the light in the necessary wavelength region from the light source and irradiating it, the embodiment of FIG. 1B is featured by that it can be manufactured very easily. That is, by exchange of the multi-layer dielectric mirror 28, the light in various wavelength regions can be selected.

In FIG. 1B, 24 is a lamp which is the light source. The lamp may have emission spectrum in the desired wavelength region and sufficient intensity. For example, it is a xenon arc lamp, or a xenon arc lamp added with a small amount of mercury, or a ultra-high pressure mercury lamp, or a low pressure mercury lamp, or a metal halide lamp, or a halogen lamp, or a deuterium lamp, or a holocathode lamp, or a flash lamp utilizing glow discharging, or an electrodeless lamp by microwave excitation. In the embodiment of FIG. 1B, a xenon arc lamp having emission spectrum also in 180–260 nm is used.

25 is a lamp house which prevents the light radiated from the lamp from being leaked to the outside.

26 is a ventilating duct with a ventilating fan for removing heat and ozone generated in the lamp house.

27 is a shutter which shields the light from the lamp, if necessary.

28 is a multi-layer dielectric mirror, by which the light in the necessary wavelength region can be reflected and have emission spectrum expanded in wide wavelength region.

29 is a lens for correcting the light flux.

In FIG. 1B, the lens is drawn as if it were made of one sheet, but actually it is constituted of a plurality of lenses in order to reduce aberration.

In the device for forming a deposited film of the present invention, it is desirable that the wavelength region of the light irradiated on the substrate surface should be generally in the UV-region and the lens material should be quartz or synthetic quartz in order to suppress the attenuation of light in the lens as little as possible. In the case when the wavelength region of the light is in the visible light region and there is no problem of attenuation of the light, the lens material is not required to be quartz.

The films which can be deposited by means of the device shown in FIG. 1 may include metal films by use of alkyl metal compounds, or metal carbonyl compounds, or metal halide compounds as a starting material. Specific examples of the gas phase compound materials may include trimethyl aluminum (chemical formula $Al_2(CH_3)_6$, hereinafter called TMAl), triethyl aluminum (chemical formula $Al(C_2H_5)_3$, hereinafter called TEAl), triiso-butyl aluminum (chemical formula $Al(C_4H_9)_3$, hereinafter called TIBAl), aluminum trichloride (chemical formula $AlCl_3$), trimethyl gallium (chemical formula $Ga(CH_3)_3$, hereinafter called TMGa), triethyl gallium (chemical formula $Ga(C_2H_5)_3$, hereinafter called TEGa), trimethyl indium (chemical formula $In(CH_3)_3$, hereinafter called TMIn), triethyl indium (chemical formula $In(C_2H_5)_3$, hereinafter called TEIn), tetraethyl tin (chemical formula $Sn(C_2H_5)_4$, hereinafter called TESn), dimethyl cadmium (chemical formula $Cd(CH_3)_2$, hereinafter called DMCd), diethyl cadmium (chemical formula $Cd(C_2H_5)_2$, hereinafter called DECd), dimethyl zinc (chemical formula $Zn(CH_3)_2$, hereinafter called DMZn), diethyl zinc (chemical formula $Zn(C_2H_5)_2$, hereinafter called DEZn), molybdenum carbonyl (chemical formula $Mo(CO)_6$), tungsten carbonyl (chemical formula $W(CO)_6$) and tungsten hexafluoride (chemical formula $WF_6$), etc. From the above materials, films containing metals such as Al, Ga, In, Sn, Cd, Zn, Mo, W, etc., as the constituents can be formed.

In the following, an example by use of the device of FIG. 1A is to be explained.

A substrate is charged through the substrate gateway 17 into the preliminary chamber for substrate charge (hereinafter called preliminary chamber) 13. The preliminary chamber is evacuated by means of an evacuation system 14 for preliminary chamber. During this operation, the reaction chamber 8 is brought internally to a vacuum degree of approximately $10^{-6}$–$10^{-8}$ Torr by means of the evacuation system for high vacuum 12. When the vacuum degree in the preliminary chamber 13 becomes approximately $10^{-6}$–$10^{-5}$ Torr, the gate valve 15 is opened. The substrate is conveyed from the preliminary chamber 13 to the chamber 9 supporting the reaction vessel and placed on the substrate supporting stand 4.

With the substrate placed on the substrate supporting stand 4, the substrate supporting stand 4 is moved to a predetermined position in the reaction chamber 8. From the starting gas feeding system 23, a diluting gas is flowed at a predetermined flow rate into the reaction vessel through the gas introducing inlet 21 and the starting gas introducing inlet 22, the reaction vessel 8 is controlled internally to a desired pressure by means of the evacuation system 11 mounted on the reaction vessel 8. Under the above state, high frequency power is applied on the high frequency coil 5 for heating substrate to heat the substrate 3 to a desired temperature. After the substrate temperature has reached the desired temperature, high frequency power is applied on the discharging electrodes 6 from the frequency power source for plasma generation 7 to generate plasma near the discharging electrodes 6 within the reaction vessel 8.

Next, a preselected light is irradiated on the substrate surface from the photoirradiation system 1.

As the next step, a starting gas containing an alkyl metal compound, a metal carbonyl compound or a metal halide compound at a predetermined partial pressure in the diluting gas is fed from the starting gas feeding device 23 through the starting gas introducing inlet 22 into the reaction chamber 8. In the plasma generation region near the discharging electrodes 6, the above starting gas molecules are excited, ionized, partially decomposed or partially undergo reaction. The excited species formed in the plasma generation region reach the substrate surface, where they react by the photon energy of the light irradiated on the substrate surface to form a desired deposited film. After completion of deposition, feeding of the starting gas containing an alkyl metal compound, a metal carbonyl compound or a metal halide compound in the diluting gas is stopped and only the diluting gas is introduced from the starting gas introducing inlet 22 into the reaction chamber 8. After the atmosphere in the reaction chamber 8 is replaced with the diluting gas to the extent that no alkyl metal compound, metal carbonyl compound or metal halide compound remains in the reaction vessel 8, the high frequency power source for plasma generation 7 and the photoirradiation system 1 are turned off and the substrate 3 is cooled. Feeding of the diluting gas from the starting gas feeding system 23 is stopped and the reaction vessel 8 is internally evacuated by means of the evacuation device for high vacuum 12. As described above, a series of thin film deposition steps is completed.

The film forming conditions when employing TMAl as the starting material and hydrogen gas (hereinafter written as $H_2$ gas) as the diluting gas are shown below. The plasma power density is 0.01–0.05 W/cm$^3$, desirably about 0.01–0.015 W/cm$^3$. The plasma power density is a value of the power applied from the plasma generating power source 7 on the electrodes for plasma generation 6 divided by the volume of the plasma generation region. The pressure within the reaction vessel 8 is 0.2–3.0 Torr, desirably about 0.5 Torr. The amount of TMAl transported is $10^{-5}$–$10^{-3}$ mol/min, desirably about $4 \times 10^{-5}$ mol/min.

Figure 2:
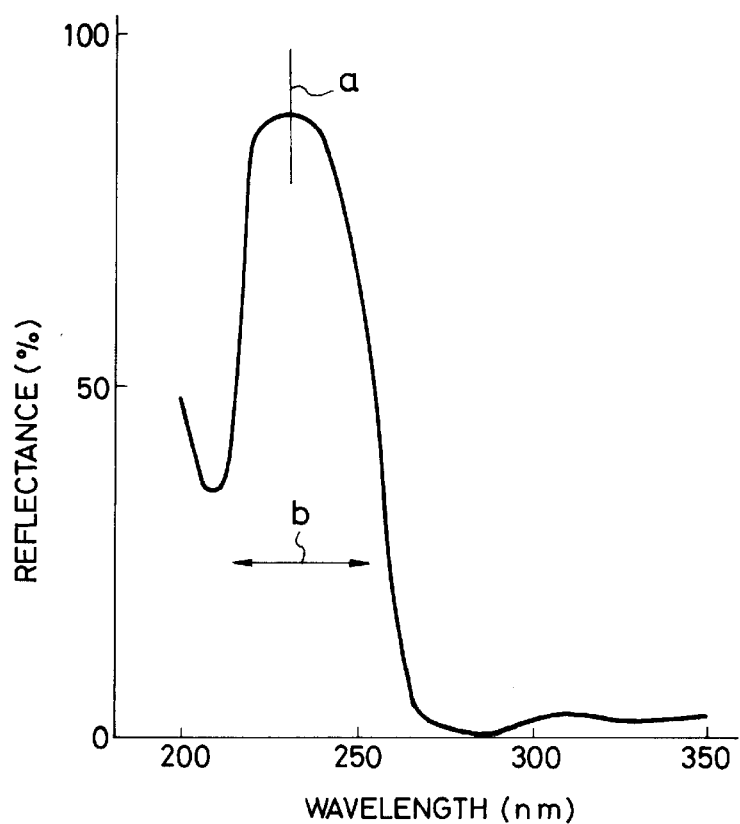
FIG. 2 is a graph showing the reflection characteristics of the multi-layer dielectric mirror used in the device shown in FIG. 1A.

The wavelength region of the light irradiated on the substrate surface is from 200 to 260 nm. The photoirradiation system used in formation of Al thin film from TMAl, in the embodiment of FIG. 1B, exhibits the reflection characteristics of the multi-layer dielectric mirror when using a xenon arc lamp as the lamp as shown in FIG. 2. In FIG. 2, a and b each represent central reflection wavelength and reflection half-value width. The photoirradiation intensity is 10–50 mW/cm$^2$. The substrate temperature is 200°–300° C., desirably about 250° C. Under the above conditions, only at the portion irradiated with light, an Al thin film was formed on the Si substrate at a film forming speed of about 800 Å/min.

As the light to be irradiated on the substrate, a light of 180–260 nm including UV absorption band wavelength of TMAl (about 180–210 nm) may be irradiated.

The plasma generation region for effecting excitation, ionization, incomplete decomposition, etc. of the starting gas molecules is separated spatially from the substrate surface, in the embodiment of FIG. 1A. In such a case when charged particles damage onto the substrate poses no problem, the plasma may be in contact with the substrate.

Figure 3:
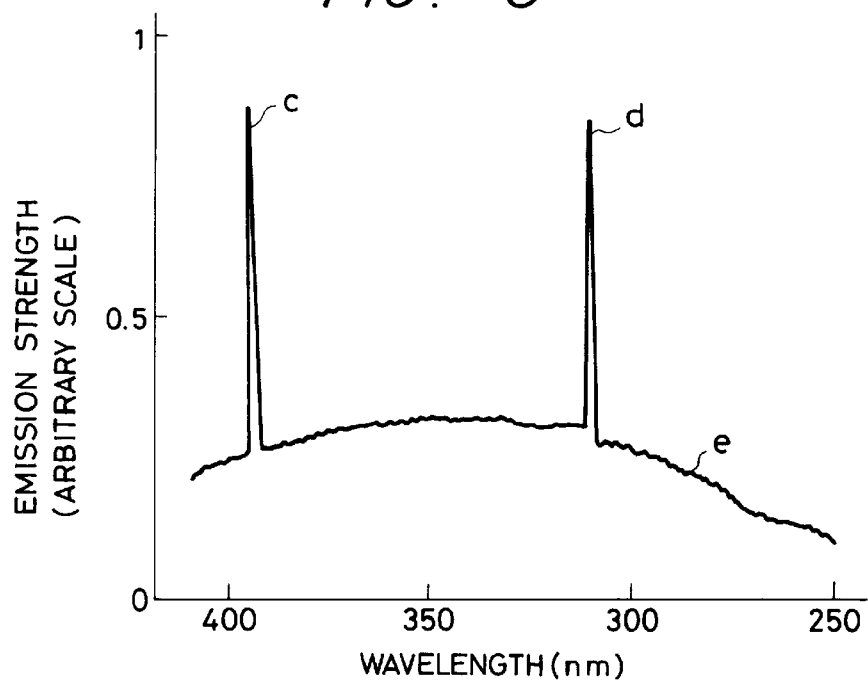
FIG. 3 is a spectral curve showing the plasma emission spectrum from the starting gas containing TMAl and $H_2$.

In formation of a deposited film by use of an alkyl metal compound, entrainment of carbon poses a problem. However, according to an Auger electronic spectroscopic measurement, no carbon atom was observed in the Al film prepared in this example. In this example, it is important to determine the power necessary for generation for plasma. The optimum value of plasma power may sometimes differ depending on the shape of reaction tube, the electrode structure, etc. The above value of 0.01–0.05 W/cm$^3$ is a value applicable for the embodiment in FIG. 1, and it cannot be applied generally in most cases. In the present invention, when the starting gas molecules are excited, ionized or partially decomposed with plasma, the power must not be applied to the extent to generate metal atoms, such as Al, etc., by complete decomposition of the alkyl metal compound. For satisfying the above condition, emission spectrum from the plasma is measured by the plasma emission spectrum measuring system 19. FIG. 3 shows an example of emission spectrum when TMAl is contained in $H_2$ which is the diluting gas, wherein c and d are emissions from the Al atoms appearing at about 394–397 nm and about 308–310 nm, respectively. The broad spectrum of e is emission of hydrogen atoms. In this embodiment, the power must not be applied to the extent such that emission spectra from Al atoms appear at 394–397 nm and at 308–310 nm as shown in FIG. 3. In the embodiment in FIG. 1, no spectrum of about 394–397 nm and about 308–310 nm was observed, when the power was 0.01–0.05 W/cm$^3$.

In the embodiment of FIG. 1, when an alkyl metal compound (TMAl, TEAl, TIBAl, TMGa, TEGa, TMIn, TEIn, DMCd, DECd, OEZn, etc.) is used as the gas phase compound, the diluting gas should desirably be $H_2$. When a part of the alkyl metal compound is decomposed in the plasma generation region, or in the vicinity of the substrate or on the substrate surface, alkyl radicals may be sometimes released. Rapid conversion of alkyl groups into stable alkanes is a method for not incorporating any carbon into the substrate. Therefore, when forming a metal thin film from an alkyl metal compound, the diluting gas should be desirably H$_2$. However, the diluting gas is not required to be constituted only of H$_2$, and may also contain N$_2$, Ar, He, etc., other than H$_2$, provided there is a sufficient amount of H$_2$ for converting the alkyl groups generated from the alkyl metal compound to stable alkanes.

In the embodiment of FIG. 1, other than formation of Al thin film from TMAl, various metal films could be formed under the conditions shown below.

The inner pressure in the reaction vessel is about 0.2–3.0 Torr. The transported amount of a metal carbonyl compound, an alkyl metal compound or a metal halide compound is about $10^{-5}$–$10^{-3}$ mol/min. The plasma power density is about 0.01–0.05 W/cm$^3$. At the above plasma power density, no emission peak from a metal element is observed in the plasma emission spectrum. In the present invention, it is required to excite, ionize, or partially decompose the starting gas molecules with plasma, and no plasma power should be applied to the extent to give rise to an emission peak from metal atoms by complete decomposition of the starting gas. When other starting materials than TMAl are employed, the emission peak from the metal atom observed when excessive plasma power is applied appears around the following wavelength regions.

In the case of TEAl, TIBAl or AlCl$_3$, it appears at about 394–397 nm and about 308–310 nm; in the case of TMGa or TEGa, at about 403 nm and about 417 nm; in the case of TMIn and TEIn, at about 303 nm and about 325 nm; about 405 nm and about 410 nm.

In the case of TESn, it appears at about 242 nm, about 317 nm and about 452 nm; in the case of DMCd or DECd, at about 229 nm, about 298 nm, about 361 nm, about 509 nm, and about 644 nm; in the case of DMZn or DEZn, at about 330 nm, 334 nm and 636 nm.

In the case of molybdenum carbonyl (chemical formula Mo(CO)$_6$), it appears at about 313 nm, about 317 nm, about 379 nm, about 386 nm and about 390 nm; in the case of tungsten hexafluoride (chemical formula WF$_6$) or tungsten carbonyl (chemical formula W(CO)$_6$), at about 401 nm and about 430 nm.

At the substrate temperature and in the wavelength region of photoirradiation as shown below, metal films could be formed only at the photoirradiated portion of about 500–1000 Å/min. The intensity of light irradiated on the substrate is about 10–100 mW/cm$^2$.

By use of TEAl, TIBAl or AlCl$_3$, Al film could be formed at a substrate temperature of 100°–300° C. and in the wavelength region of about 200–260 nm of the light irradiated on the substrate.

By use of TMGa or TEGa, without heating the substrate and in the wavelength region of 200–260 nm of the light irradiated on the substrate, a Ga film could be formed. By use of TMIn or TEIn, an In film could be formed at a substrate temperature of about 100°–150° C. and in the substrate irradiation light wavelength region of about 200–260 nm. By use of TESn, Sn film could be formed at a substrate temperature of about 100°–200° C. and in the substrate irradiation light wavelength region of about 200–260 nm.

By use of DMCd or DECd, a Cd film could be formed at a substrate temperature of about 150°–250° C. and in the substrate irradiation light wavelength region of about 250–300 nm.

By use of DMZn or DEZn, a Zn film could be formed at a substrate temperature of about 150°–250° C. and in the substrate irradiation light wavelength region of about 200–360 nm.

By use of tungsten carbonyl (chemical formula Mo(CO)$_6$) or tungsten hexafluoride, a W film could be formed at a substrate temperature of 250°–350° C. and in the substrate irradiation light wavelength region of 250–300 nm.

By use of molybdenum carbonyl (chemical formula a Mo(CO)$_6$), Mo film could be formed at a substrate temperature of 250°–350° C. and in the substrate irradiation light wavelength region of 250–300 nm.

In the above metal films, no carbon atom was detected according to the Auger electronic spectroscopic method. Under the above forming conditions, the substrate irradiation wavelength region shown is longer than the absorption peak wavelength region of the starting gas employed. On the substrate, a light in the wavelength region near the absorption peak of the starting gas employed may be irradiated. By irradiation of a light with longer wavelength than the substrate irradiation wavelength region indicated under the above forming conditions, the film forming speed will not become greater unless the substrate temperature is elevated.

Figure 4A:
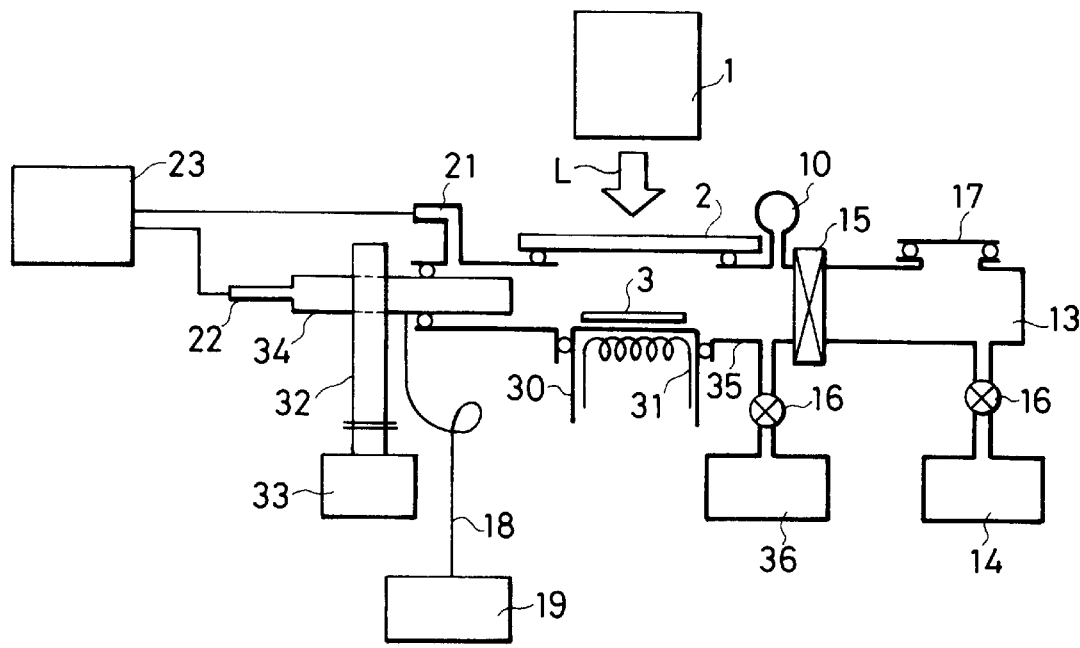
FIG. 4A, FIG. 4B and FIG. 5 each illustrate other examples of the device of the present invention, respectively.
Figure 4B:
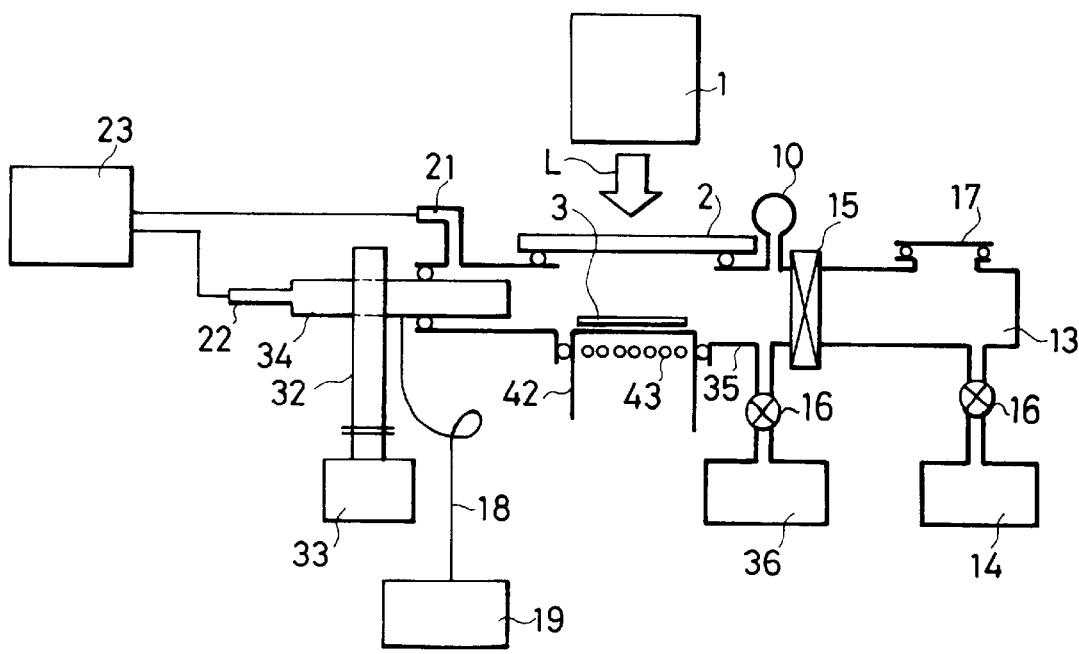

FIGS. 4A and 4B each illustrate schematically another constitutional example of the device of the present invention in which one kind of the gas of the above gas phase compound is used as the starting material. In the embodiments of FIGS. 4A and 4B, the flow of the starting gas is made laminar in order to improve uniformity of film thickness within the substrate. Such embodiments have the specific feature of being capable of complying easily with a large size substrate, since the flow of the starting gas is in parallel to the substrate 3.

To represent the same element as in FIG. 1 with the same symbol, 1 is a system for irradiating light on the substrate and has the same construction as in the system shown in FIG. 1B. 2 is a light transmitting window for transmitting the light in the necessary wavelength region. The light transmitting window is made of a material such as molten quartz, synthetic quartz, sapphire, magnesium fluoride, lithium fluoride, calcium fluoride, barium fluoride, etc. In the device of the present invention, the wavelength of the light irradiated onto the substrate surface is frequently longer than 200 nm, and the light transmitting window should desirably be made of synthetic quartz for easiness in handling. For prevention of fog on the light transmitting window, a gas such as H$_2$, He, Ar, N$_2$, etc., may be blown against the window.

3 is a substrate which is generally a semiconductor wafer such as of silicon, gallium arsenide, etc. However, the substrate is not limited to semiconductor wafers, and glass, metal, etc., may be employed.

30 is a substrate supporting stand and in the embodiments of FIG. 4A, a heater 31 is embedded within the substrate supporting stand 30 to heat the substrate 3.

32 is a waveguide.

33 is a microwave power source for generation of plasma. In the embodiment of FIG. 4, it can be made, for example, a practical frequency of about 2.45 GHz.

34 is an activation furnace which is desirably made of an insulating material. In the embodiments of FIGS. 4A and 4B, it is made of quartz. Into the activation furnace is fed the starting gas through the starting gas introducing inlet 22. The waveguide 32 and the activation furnace 34 are arranged substantially perpendicular to each other, and plasma will be generated around the portion where the waveguide 32 crosses the activation furnace 34.

35 is a reaction chamber. It is made of stainless steel for easiness of working in the embodiment of FIG. 4.

In the embodiment of FIG. 4, the substrate irradiating light enters perpendicular to the substrate 3. The distance between the substrate 3 and the light incident window 2 is about 1 to 3 cm.

10 is a pressure gauge which monitors the pressure within the reaction chamber 35 during deposition. A diaphragm system absolute pressure vacuum gauge is used, which will not change in indication value regardless of the kind of the gas within the reaction chamber 35.

36 is a vacuum evacuation system for evacuating internally the reaction chamber 35.

Figure 5:
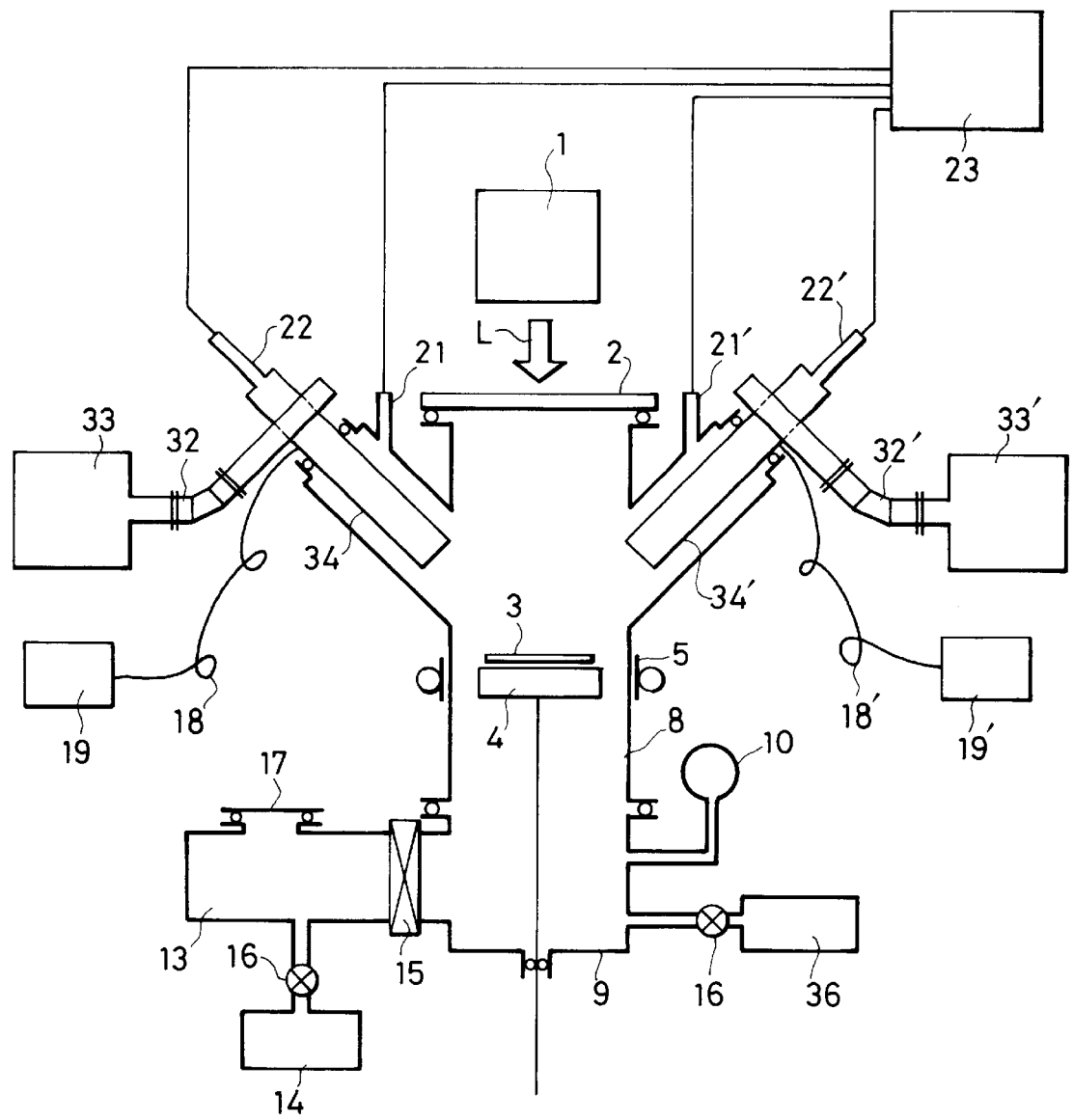

The embodiment of FIG. 5, consists of a corrosion resistant turbo molecular pump and a rotary pump connected in series. The above constitution has both the function of evacuating internally the reaction vessel to a high vacuum of about $10^{-6}$–$10^{-8}$ Torr and the function of evacuating the reaction chamber 35 to a desired pressure when the starting gas is flowing during film formation. The construction of the vacuum pump is not limited to the above embodiment, provided that it is capable of high vacuum evacuation and evacuation during film formation.

13 is a preliminary chamber for substrate charge. It has a mechanism for conveying the substrate 3 delivered from the substrate gateway 17 into the preliminary chamber for substrate charge 13 and into the reaction chamber 35.

14 is an evacuation system for evacuating the preliminary chamber for substrate charge 13 to vacuum.

15 is a gate valve for separating the preliminary chamber for substrate charge 13 from the reaction chamber 35.

16 is a valve.

17 is a gateway for the substrate.

In the embodiment of FIG. 4, the preliminary chamber 13 for charging of substrate is provided so that the reaction chamber 35 will not internally be contaminated through contact with air containing oxygen, etc.

18 is an optical fiber. It leads the light of plasma emission to the plasma emission spectrum measuring system 19.

19 is a plasma emission spectrum measuring system. It is used for measuring the plasma emission spectrum for determining the power during gas phase excitation of the starting gas. It is also a monitor for observing whether the plasma is being generated under the same state every time.

As a means for observing the state of plasma, there is, for example, the method in which the gas formed in the reaction chamber 35 is qualitatively analyzed by means of a quadrupole mass analyzer, etc. For observing the plasma state, other than the plasma emission spectrum measuring system, the above quadrupole mass analyzer, etc., may also be employed.

21 is a gas introducing inlet for introducing a gas such as $H_2$, Ar, He or $N_2$, etc. (hereinafter written as diluting gas) at a predetermined flow rate from the starting gas feeding system 23. Other gases than diluting gas may also be introduced.

22 is a starting gas introducing inlet for introducing the starting gas desired to be excited in gas phase in the plasma generation region as well as a diluting gas from the starting gas feeding system 23 and into the reaction chamber 35.

23 is a starting gas feeding system for feeding the diluting gas and the starting gas at a predetermined flow rate and pressure through the gas introducing inlet 21 and the starting gas introducing inlet 22 into the reaction chamber 35.

FIG. 4B shows an embodiment in which only the substrate supporting stand portion in the embodiment FIG. 4A is changed. 42 is a substrate supporting stand and 43 is a lamp for heating substrate. The light from the lamp for heating the substrate is absorbed by the substrate thus heating the substrate. The substrate supporting stand 42 must be made of a material which can transmit the light from the lamp for heating substrate 43.

While the heating method by means of the heater in FIG. 4A has the advantage of simpleness, there are involved the drawbacks such that the substrate supporting stand 30 and the substrate 3 must contact each other over substantially the entire surface of the substrate 3 so that heat can be transmitted from the substrate supporting stand 30 to the substrate 3 and that it takes long time for cooling of the substrate 3 after film formation due to the heat content of the substrate supporting stand 30.

On the other hand, in the lamp heating system in FIG. 4B, there are such advantages that the substrate supporting stand 42 is not required to contact the substrate 3, namely only a part of the substrate supporting stand may contact the substrate to hold it, such that the heating or cooling time is short since only the substrate 3 is heated, whereby the film forming speed per one substrate becomes rapid when film formation is performed on a number of substrates continuously.

By means of the device shown in FIGS. 4A and 4B, a deposited film can be formed similarly as in FIG. 1A.

Next, an example by use of the device show in FIG. 4A is to be explained.

A substrate is charged through the gateway for substrate 17 into the preliminary chamber for substrate charge (hereinafter called preliminary chamber) 13. The preliminary chamber is evacuated by means of the evacuating device for charging substrate 14. During this operation, the reaction chamber 35 is internally evacuated to a pressure of about $10^{-6}$–$10^{-8}$ Torr by means of the evacuating device 36. When the pressure in the preliminary chamber 13 becomes about $10^{-6}$–$10^{-5}$ Torr, the gate valve 15 is opened. The substrate is conveyed from the preliminary chamber 13 to the reaction chamber 35 and placed on the substrate supporting stand 30.

With the substrate 3 placed on the substrate supporting stand 30, the substrate supporting stand 30 is moved to a predetermined position in the reaction chamber 35.

From the starting gas feeding system 23 through the gas introducing inlet 21 and the starting gas introducing inlet 22, diluting gas is flowed at a predetermined flow rate into the reaction chamber 35. The reaction chamber 35 is internally evacuated to a predetermined pressure by means of the evacuation system 36 mounted on the reaction chamber 35. Under the above state, a voltage is applied on the heater 31 for heating substrate to heat the substrate 3 to a predetermined temperature. After the substrate temperature has reached the desired temperature, microwave power is thrown into the waveguide 32 from the microwave power source for plasma generation 33. Plasma is generated around the portion whether the waveguide 32 crosses the activation furnace 34.

Next, from the photoirradiation system 1, a desired light is irradiated on the substrate surface. Then, a gas phase compound containing an alkyl metal compound, a metal carbonyl compound or a metal halide compound at a predetermined partial pressure in the diluting gas is fed from the starting gas feeding device 23 through the starting gas introducing inlet 22 into the reaction chamber 35.

In the plasma generation region, the above starting gas is excited or ionized, or a part of the starting gas molecules is decomposed. The above starting gas excited, ionized or partially decomposed in the plasma generation region reaches the substrate surface where it reacts by the photoenergy of the light irradiated on the substrate surface to become a desired film. After completion of formation of the deposited film, feeding of the starting gas containing an alkyl metal compound, a metal carbonyl compound, etc. In the diluting gas is stopped, and only the diluting gas is introduced from the starting gas introducing inlet 22 into the reaction chamber 35. After the reaction chamber 35 is internally replaced with the diluting gas to the extent that no alkyl metal compound, metal carbonyl compound or metal halide compound remains in the reaction chamber 35, the microwave power source for plasma generation 33 and the photoirradiation system 1 are turned off and the substrate 3 is cooled. Feeding of the diluting gas from the starting gas feeding system 23 is stopped and the reaction chamber 35 is internally evacuated to about $10^{-6}$–$10^{-8}$ Torr by means of the evacuation system 36. As described above, a series of the thin film deposition steps has been completed.

When the devices shown in FIG. 4A and FIG. 4B were employed, it was confirmed that metal films could be formed similarly by use of an alkyl metal compound, a metal carbonyl compound or a metal halide compound by selecting the same plasma conditions, substrate temperature and photoirradiation wavelength region as in the device shown in FIG. 1A.

FIG. 5 illustrates schematically one example of the device according to the present invention for formation of a compound film by using two or more kinds of the above gas phase compounds as the starting material. This is particularly suitable for formation of a thin film with a plural number of constituent elements, for example, a compound semiconductor thin film such as GaAs, InP, etc., or an insulating thin film such as AlN, $SiO_2$, $Si_3N_4$, etc.

In FIG. 5, although only two starting gas introducing inlets are drawn, the number of the gas phase compounds may be 3 or more and all of the gas phase compounds may be each independently permitted to pass through the plasma generation region. Alternatively, in the case of, for example, three starting gases, two of them may be permitted to pass through the same plasma generation region, while the other one passes through another plasma generation region. It is not necessarily required that all of the gas phase compounds should be permitted to pass through the plasma generation region, but any desired number of the gas phase compounds among the plural number of gas phase compounds may be permitted to pass through the plasma generation region.

In FIG. 5, the gas phase compound is introduced obliquely relative to the substrate. The introducing direction is not limited to the oblique direction, but it may be either vertical or parallel relative to the substrate.

To represent the same element as in FIG. 1 with the same symbol, 1 is a photoirradiation system for irradiating light on a substrate and has the same constitution as the system shown in FIG. 1B.

2 is a light transmitting window for transmitting the light in the necessary wavelength region, and the light transmitting window is made of a material such as molten quartz, synthetic quartz, sapphire, magnesium fluoride, lithium fluoride, calcium fluoride, barium fluoride, etc. In the present invention, the wavelength of the light irradiated on the substrate surface is longer than 200 nm in most cases, and the light transmitting window is desirably made of synthetic quartz for easiness in handling. For prevention of fog on the light transmitting window, a gas such as $H_2$, He, Ar, $N_2$, etc., may be blown against the window.

3 is a semiconductor wafer generally of silicon, gallium arsenide, etc. However, the substrate is not limited to semiconductor wafers, but a glass or metal substrate may be employed.

4 is a substrate supporting stand.

As shown in this embodiment, when the wafer is heated externally by high frequency heating, it is a block made of a material such as carbon, or carbon coated with SiC or a metal such as molybdenum. For easiness in handling, carbon caoted with SiC is used in this embodiment.

5 is a high frequency coil for heating the substrate, which is mounted at the outer circumference of the reaction vessel 8. The substrate is heated by high frequency induction heating. The substrate heating system is not limited to high frequency induction heating.

32 and 32' are waveguides.

33 and 33' are microwave power sources for plasma generation. The frequency is about 2.45 GHz.

34 and 34' are activation furnaces and desirably made of an insulating material. In the embodiment shown in FIG. 5, they are made of quartz. Into the activation furnaces are fed gas phase compounds through the starting gas introducing inlets (22 and 22'). The wave guides (32, 32') and the activation furnaces (34, 34') are arranged substantially perpendicular to each other, and plasma is generated around the portions where the waveguides (32, 32') cross the activation furnaces 34, 34'.

8 is a reaction vessel. In the embodiment shown in FIG. 5, since induction heating system by a high frequency coil 5 mounted externally of the reaction vessel is used as the substrate heating system, the reaction vessel material should desirably be made of an insulating material such as quartz, etc.

In the embodiment of FIG. 5, the reaction vessel has a single tubular structure of quartz. The reaction vessel may also have a double tubular structure of quartz so as to be cooled with water.

9 is a chamber supporting the reaction vessel, and it is made of a stainless steel.

10 is a pressure gauge for monitoring the pressure within the reaction vessel 8 during deposition. A diaphragm system absolute pressure vacuum gauge is used, which will not change in indication value regardless of the kind of the gas within the reaction vessel 8.

36 is a vacuum evacuation system for evacuating internally the reaction chamber. In the embodiment of FIG. 5, it consists of a corrosion resistant turbo molecular pump and a rotary pump connected in series. According to the above construction, it is capable of evacuating internally the reaction vessel to high vacuum and the function of evacuating the reaction chamber to a desired pressure when the starting gas is flowing during film formation. The constitution of the vacuum pump is not limited to the above embodiment, provided that it has both functions of high vacuum evacuation and evacuation during film formation.

13 is a preliminary chamber for substrate charge. It has a mechanism for conveying the substrate 3 delivered through the gateway for substrate 17 into the preliminary chamber for substrate charge 13 to the reaction vessel 8.

14 is an evacuation system for evacuating the preliminary chamber for substrate charge 13 to vacuum. 15 is a gate valve for separating the preliminary chamber 13 for substrate charge from the chamber 9 supporting the reaction vessel.

16 is a valve.

17 is a gateway for substrate.

In the embodiment of FIG. 5, the preliminary chamber 13 for substrate charge is provided so that the reaction vessel 8 may not internally by contaminated through contact with air containing oxygen, etc.

18 and 18' are optical fibers. They are provided for leading the light of plasma emission to the plasma emission spectrum measuring systems 19, 19'.

19 and 19' are plasma emission spectrum measuring systems. They are used for measurement of plasma emission spectra for determining the power during gas phase excitation of gas phase compounds. They are also monitors for observing whether plasma is generated at the same state for every time.

As a means of observing the state of plasma, there is, for example, the method in which the gas formed in the reaction vessel 8 is qualitatively analyzed by use of or a quadrupole mass analyzer. Other than the plasma emission spectrum measuring system, the above quadrupole mass analyzer, etc., may be also employed for observation of plasma state.

21 and 21' are gas introducing inlets for introducing a gas such as $H_2$, Ar, He or $N_2$ (hereianfter written as diluting gas) at a predetermined flow rate from the starting gas feeding system. Other gases than diluting gas may also be introduced.

22 and 22' are starting gas introducing inlets for introducing the gas phase compound desired to be excited in gas phase in the plasma generation region and a diluting gas from the starting gas feeding device 23 into the reaction vessel 8.

23 is a starting gas feeding system for feeding the diluting gas and the gas phase compound at predetermined flow rates and predetermined pressures through the gas introducing inlets (21, 21'), and the starting gas introducing inlets (22, 22') into the reaction vessel 8.

As the film which can be deposited by use of the devcie of FIG. 5, there may be included III-V compound semiconductors using an alkyl metal compound of the group III element and a hydride of the group V element as the starting materials, III-V compound semiconductors using an alkyl metal compound of the group III metal and an alkyl compound of the group V element, II-VI compound semiconductors using an alkyl metal compound of the group II element and a hydride of the group VI element as the starting materials, II-VI compound semiconductors using an alkyl metal compound of the group II element and an alkyl compound of the group VI element as the starting materials, silicon nitride films using silicon hydrides such as silane ($SiH_4$) or a disilane ($Si_2H_6$) and ammonia ($NH_3$) or nitrogen ($N_2$) as the starting materials, and silicon oxide films using silicon hydrides such as silane ($SiH_4$) or disilane ($Si_2H_6$) and nitrous oxide ($N_2O$) or oxygen ($O_2$) as the starting materials.

In the following, an example by use of the device of FIG. 5 is to be explained.

A substrate is charged through a gateway for substrate 17 into a preliminary chamber for substrate charge (hereinafter called preliminary chamber) 13. The preliminary chamber is evacuated by an evacuating system 14 for the preliminary chamber. During the operation, the reaction vessel 8 is internally evacuated by an evacuation system 36 to a pressure of about $10^{-6}$–$10^{-8}$ Torr. When the pressure in the preliminary chamber 13 becomes about $10^{-6}$–$10^{-5}$ Torr, the gate valve 15 is opened. The substrate is conveyed from the preliminary chamber 3 to the chamber 9 supporting the reaction vessel and placed on the substrate supporting stand 4. With the substrate placed on the substrate supporting stand 4, the substrate supporting stand 4 is moved to a predetermined position in the reaction vessel 8. From the starting gas feeding system 23 through the gas introducing inlets (21, 21') and the starting gas introducing inlets (22, 22'), the diluting gas is flowed into the reaction chamber at a predetermined flow rate. The reaction vessel 8 is internally evacuated to a predetermined pressure by means of the evacuating device 36 mounted on the reaction vessel 8. Under the above state, high frequency power is applied on the high frequency coil for heating substrate 5 to heat the substrate 3 to a desired temperature. After the substrate temperature has reached the desired temperature, microwave power is thrown into the wave guides (32, 32') from the microwave power sources for plasma generation (33, 33'). Plasma is generated around the portions where the waveguides (32, 32') cross the activation furnaces (34, 34').

As the next step, from the photoirradiation system 1, a desired light is irradiated on the substrate surface. Starting gases containing alkyl metal compounds, etc., at predetermined partial pressure in diluting gas are fed from the starting gas feeding system 23 through the starting gas introducing inlets 22, 22' into the reaction vessel 8.

For example, when a III-V compound thin film is formed, $H_2$ gas is fed through the gas introducing inlet 21, an alkyl metal compound of the group III element diluted with $H_2$ gas through the starting gas introducing inlet 22, $H_2$ gas through the gas introducing inlet 21' and a hydride of the group V element diluted with $H_2$ gas through the starting gas introducing inlet 22'. In the plasma generation region, the above starting gases are excited or ionized, or a part of the starting gas molecules is decomposed. The above starting gases excited, ionized or partially decomposed in the plasma generation region reach the substrate surface where they react by the photo energy of the light irradiated on the substrate surface to become a desired deposited film. After formation of a deposited film, only the diluting gas is introduced into the reaction vessel through the starting gas introducing inlets (22, 22'). After the reaction vessel has been filled with the diluting gas, the microwave power sources for plasma generation 33, 33' and the photoirradiation system 1 are turned off, and the substrate 3 is cooled. Feeding of the diluting gas from the starting gas feeding system 23 is stopped and the reaction vessel 8 is internally evacuated by the evacuating system 36. As described above, a series of thin film preparing steps are completed.

For example, when employing TMAl and $NH_3$ as the starting gases and $H_2$ as a diluting gas, the conditions for forming AlN thin film are shown below. The pressure is 0.2–3.0 Torr, the total diluting gas flow rate about 50–200 SCCM, the flow rate of $NH_3$ about 200 SCCM, and the amount of TMAl transported about $1\times10^{-5}$ mol/sec. The plasma power density is, in the embodiment of FIG. 5, about 0.01–0.05 w/cm$^3$ for TMAl and about 0.05–0.1 w/cm$^3$ for $NH_3$. The wavelength region of the light irradiated is about 200–260 nm, and the light source lamp is Xe DE lamp.

Under the above conditions, an AlN thin film is deposited at a deposition speed of 500–800 Å/min at a substrate temperature of aobut 300°–500° C.

For example, when employing TMGa and $AsH_3$ as the starting gases and $H_2$ as the diluting gas, the conditions for formation are shown below. The pressure is 0.2–3.0 Torr, the total flow rate of diluting gas about 50–200 SCCM, the flow rate of $AsH_3$ about 200 SCCM and the amount of TMGa transported about $1\times10^{-5}$ mol/sec. The plasma power density is, in the embodiment of FIG. 5, about 0.01–0.05 w/cm$^3$ for TMGa and about 0.05–0.1 w/cm³ for AsH₃. The wavelength region of the light irradiated is about 200–260 nm and the light source lamp is Xe arc lamp.

Under the above conditions, an GaAs thin film is deposited at the deposition speed of 500–800 Å/min at a substrate temperature of about 300°–500° C.

FIG. 6 shows other embodiments of the photoirradiation system other than that shown in FIG. 1B. The photoirradiation system consists basically of a light source and an optical system. The photoirradiating device has the function capable of irradiating a light in a desired wavelength region, at a desired intensity on the desired place on the substrate.

In FIG. 6, 24 is a lamp which is the light source. The lamp has a light spectrum of a desired wavelength region and it may have a sufficient intensity. For example, it may be a xenon arc lamp or a xenon arc lamp added with a small amount of mercury, or a ultra-high pressure mercury lamp, or a low pressure mercury lamp, or a metal halide lamp, or a halogen lamp, or a deuterium lamp, or a holocathode lamp or a flash lamp utilizing glow discharging, or an electrodeless lamp by microwave excitation. When using an optical system for collecting light flux as in the embodiments shown in FIG. 6A–FIG. 6F, the luminance of light source should desirably be higher. For example, it is a xenon arc lamp, or a xenon arc lamp added with a small amount of mercury or a ultra-high pressure mercury lamp. It is desirable to use a xenon arc lamp having also emission spectrum at about 180–250 nm.

25 is a lamp house, 26 is a ventilating duct and ventilating fan, 27 a shutter, 28 a multi-layer dielectric mirror and 29 a lens.

37 is a spectroscope. It is utilized for taking out a spectrum of a necessary wavelength region in a lamp which gives emission spectrum which is expanded from UV-wavelength region to IR region. As the spectroscope, it is preferable to use a so-called bright spectroscope with small f number rather than a precise spectroscope having high resolution.

Figure 6A:
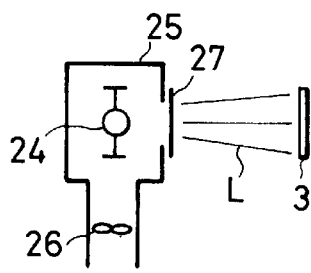
FIG. 6A through FIG. 6F illustrate schematically other embodiments of the photoirradiation systems to be used in the present invention, respectively.
Figure 6B:
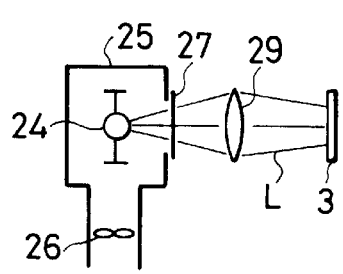
Figure 6C:
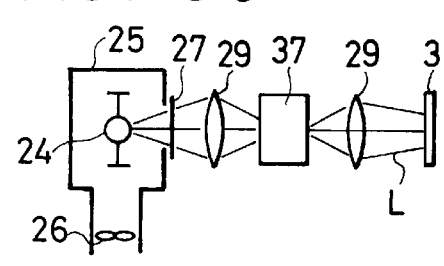
Figure 6D:
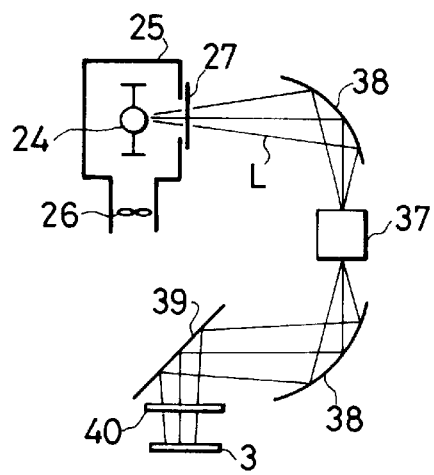

In the embodiments of FIG. 6C and FIG. 6D, a spectroscope with f number of 3 is employed.

38 is a spherical mirror. When the light flux is converged at a lens, the focus distance varies due to color aberration of the lens. In the case of spherical mirror, due to absense of color aberration, it is rendered possible to focus the light flux of all the wavelength regions at the same position.

39 is a total reflection mirror, which is a mirror of which reflection characteristics are not dependent on wavelength.

In the embodiments shown in FIG. 6A and FIG. 6B, all of the light reaching the substrate, even the light with the wavelength which does not contribute to the reaction on the substrate surface are irradiated on the substrate surface. This is an embodiment used in the case of a lamp having generally a narrow emission spectrum wavelength region. For example, it is a low pressure mercury lamp, or a deuterium lamp, or a holocathode lamp, or holocathode lamp utilizing glow discharging. In the case when the light in the wavelength region which does not contribute to the reaction may be irradiated on the substrate, other lamps than those as mentioned above are sufficiently applicable for the embodiments in FIG. 6A and FIG. 6B.

FIG. 6C and FIG. 6D show embodiments which can take out only the light of a specific wavelength region from a lamp of broad emission spectrum wavelength region by use of a spectroscope. In FIG. 6C, light flux is collected by use of a lens. When a lens is used, there is the specific feature that an optical system for collecting the light flux can be easily constituted, provided that the focus distance of the lens can be known. However, in handling of a light having wavelength shorter than 300 nm, due to color aberration of the lens, there is the drawback that the focus position may be shifted depending on the wavelength of light.

Figure 6E:
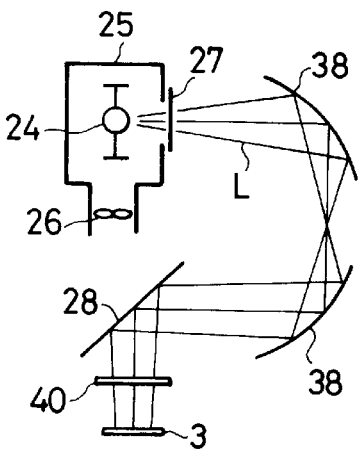

FIG. 6D is specific in that color aberration is removed by use of a mirror as an image forming optical system. FIG. 6C and FIG. 6D are embodiments of the light irradiation systems used for determining the wavelength region at which the surface reaction can occur in the present invention. FIG. 6E is an embodiment in which only a spectrum of a specific wavelength region is taken out form a lamp with broad emission spectrum wavelength region by use of a multi-layer dielectric mirror. FIG. 6E is an embodiment in which the light flux is collected by use of a spherical mirror. The method of using the cold mirror in FIG. 6E can select the spectrum with a half value width of about 60 nm. This is an embodiment of the photoirradiation system in a device for high speed growth, since the intensity can be generally made greater than in the case of using a spectroscope.

For making the photoirradiation pattern on the substrate any desired shape, it is possible to place a mask 40 at an appropriate position in the embodiments of FIGS. 6D and 6E.

As shown in the embodiments of FIG. 1, FIG. 4 and FIG. 5, a thin film can be deposited at any desired place on the substrate, since deposition occurs only at the photoirradiated portion.

Figure 6F:
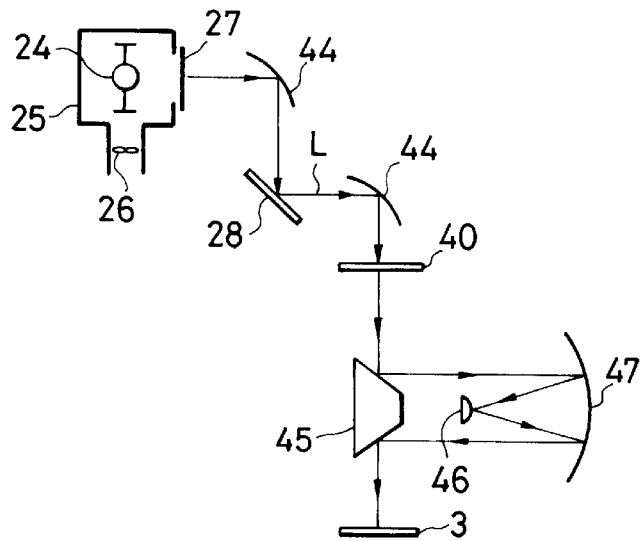

As an embodiment for making the photoirradiation pattern on the substrate any desired shape, there is an embodiment of using a projection optical system shown in FIG. 6F.

44 is a rotational spherical mirror, 45 a trapezoid mirror, 46 a convex mirror and 47 a concave mirror. By moving of the trapezoid mirror right and left on the paper surface, light can be irradiated with the same pattern as the mask 40 on the substrate 13. Although this is an optical system resembling a projection exposure device, it is entirely different from the concept of exposure device in that a multilayer dielectric mirror 28 for selecting the wavelength is used.

In the embodiments of FIG. 1B and FIG. 6A–FIG. 6F, lamp is used as a light source, however, the light source is not limited to lamp, but a laser may be used if it has emission spectrum in the desired wavelength region with sufficient intensity. Particularly, when employing intermittent light with great peak power, Xe flash lamp, a pulse oscillated laser (e.g. N₂ laser, excimer laser, etc.), is desirably used.

The embodiments in FIG. 1 and FIG. 4 have been described by referring to the case when one kind of starting gas is employed. However, also in the embodiment of FIG. 1 and FIG. 4, the starting gas is not limited to one kind.

Figure 7:
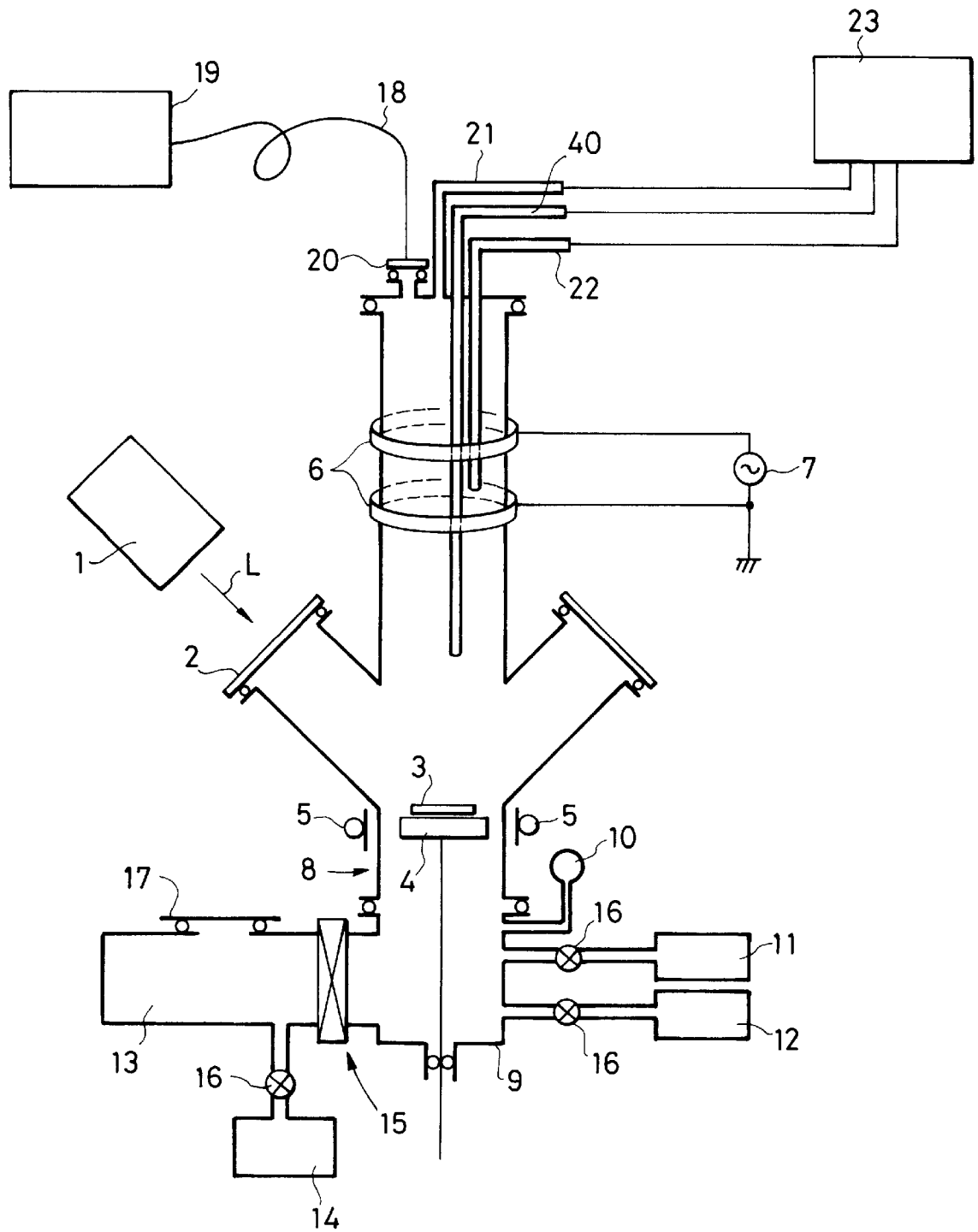
FIG. 7 illustrates schematically another example of the device of the present invention.

As shown in the embodiment of FIG. 7, another gas introducing inlet 40 may be provided in addition to the gas introducing inlet 21 and the starting gas introducing inlet 22, and the respective inles can be used separately from each other. For example, a gas phase compound which can undergo photoreaction with difficulty can be introduced at the position at the plasma generation region or upstream side thereof. On the other hand, a gas phase compound which can undergo photoreaction easily or generates excited species with short life can be introduced at the position at the plasma generation region or downstream side thereof.

Specifically, for example, H₂ and TMAl are fed through the starting gas introducing inlet 22 and H₂ containing Si₂H₆ through the starting gas introducing inlet 40 newly provided into the reaction vessel. Under the same film forming conditions in the description of the embodiment in FIG. 1, Al—Si alloy containing about 1–5% of Si in Al could be formed. By use of $TiCl_2$ in place of $Si_2H_6$, Al—Ti alloy can be obtained.

The embodiments in FIG. 1 and FIG. 4 have been described primarily about metal thin films, the embodiments in FIG. 1 and FIG. 4 are not limited to metal thin films, and Si single crystalline, Si polycrystalline or Si amorphous thin films could be formed by use of, for example, silane ($SiH_4$) or disilane ($Si_2H_6$).

According to the present invention, dense and good quality deposited films can be formed at a relatively low substrate temperature and yet while maintaining a practical deposited film forming speed without giving damages by charged particles.

For example, in the prior art, there has been no technique for forming a metal thin film only at a desired position on a substrate at a low temperature of 100° to 350° C. at a deposition speed of 500 to 1000 Å/min without damage by charged particles. According to the present invention, it is possible to form a film while fully satisfying such requirements.

In the method of the present invention, the reaction for forming excited species of a gas phase compound containing atoms which become the constituents constituting the deposited film and the surface reaction on the substrate surface can be conducted under the state where they can be independently controlled, whereby it is possible to prevent formation of decomposed products by the gas phase reaction and deposition of the decomposed products on the substrate. Also, in the case when two or more kinds of different compounds are used as the above gas phase compound, since these compounds can be respectively fed onto the substrate surface as separate excited species, formation of the gas phase reaction product between these compounds can be suppressed and a deposited film can be formed only by the surface reaction on the substrate surface by preventing these gas phase reactions, and therefore a dense and good quality deposited film containing no impurity can be formed.

Moreover, since the gas phase compound is fed previously as excited species on the substrate surface, adsorption of gas onto the substrate surface or the surface reaction will readily occur. Further, by photoirradiation on the substrate surface, photochemical reaction which cleaves the bonds of excited species, which exist on the substrate surface and are more enhanced in probability of collision against photons than in the gas phase, may be caused to occur or the surface reaction is promoted by the local heat generation by the photon energy absorbed by the substrate. Due to such actions, a practical deposited film forming speed can be maintained at a relatively low substrate temperature.

We claim:

1. An apparatus for forming a chemically vapor deposited film comprising:

a first gas phase compound supplying means for supplying onto a substrate which is set in a reaction vessel a first gas phase compound comprising constituent atoms of the deposited film and provided from a source capable of delivering a compound selected from the group consisting of metal carbonyl compounds, alkylmetal compounds and metal halides;

an excitation energy supplying means for supplying an excitation energy to at least said first gas phase compound to form excited species of the first gas phase compound;

a second gas phase compound supplying means for supplying onto said substrate a dilution gas or a second gas phase compound to react with said first gas phase compound, wherein said second gas phase compound supplying means is located downstream of the position of said first gas phase compound supplying means;

means for taking the emission spectrum of plasma generated by excitation of said first gas phase compound;

a substrate supporting means located downstream of the supply positions of said first and said second gas phase compounds;

an evacuation means located downstream of said substrate supporting means;

a preliminary chamber which communicates with said reaction vessel through a gateway for delivering said substrate into said reaction vessel; and a photoirradiation system comprising a spectroscope or laser light source for effecting photoirradiation with light of a wavelength longer than the absorption peak of said first gas phase compound or said second gas phase compound onto said substrate, whereby the surface of said substrate is photoirradiated to form the deposited film through surface reaction of said excited species.

2. An apparatus for forming a deposited film according to claim 1 wherein said exciting energy supplying means is arranged internally or externally of a deposition chamber housing said substrate or of a chamber or a tube forming as a supplying route for said gas phase compounds continuous to said deposition chamber.

3. An apparatus for forming a deposited film according to claim 1, wherein said exciting energy supplying means is a means for exciting the gas phase compound with electrical energy.

4. An apparatus for forming a deposited film according to claim 3, wherein the exciting energy supplying means is a means for supplying exciting energy by glow discharging or arc discharging.

5. An apparatus for forming a deposited film according to claim 1, wherein the wavelength of the light irradiated on the substarte surface is selected by providing a light filtering means in the photoirradiation system.

6. An apparatus for forming a deposited film according to claim 1, wherein a means for heating the substrate in the deposition chamber is provided.

7. An apparatus for forming a deposited film according to claim 1, wherein a means for patterning the light irradiated on the substrate surface is provided in the photoirradiation system.

8. An apparatus for forming a chemically vapor deposited film comprising:

a first gas phase compound supplying means for supplying onto a substrate which is set in a reaction vessel a first gas phase compound comprising constituent atoms of the deposited film and provided from a source capable of delivering a compound selected from the group consisting of metal carbonyl compounds, alkyl metal compounds and metal halides;

an excitation energy supplying means for supplying an excitation energy to at least said first gas phase compound to form excited species of the first gas phase compound;

a second gas phase compound supplying means for supplying onto said substrate a dilution gas or a second gas phase compound to react with said first gas phase compound, wherein said second gas phase compound supplying means is located downstream of the position of said first gas phase compound supplying means;

means for taking the emission spectrum of plasma generated by excitation of said first gas phase compound;

a substrate supporting means located downstream of the supply positions of said first and said second gas phase compounds;

an evacuation means located downstream of said substrate supporting means;

a preliminary chamber which communicates with said reaction vessel through a gateway for delivering said substrate into said reaction vessel; and a photoirradiation system comprising a spectroscope or laser light source for effecting photoirradiation with light of a wavelength longer than the absorption peak of said first gas phase compound or said second gas phase compound onto said substrate, whereby the surface of said substrate is photoirradiated to form the deposited film, said film being essentially free of carbon contaminants, through surface reaction of said excited species.

9. An apparatus for forming a chemically vapor deposited film according to claim 1, wherein said second gas phase compound is a compound which is more reactive than said first gas phase compound or capable of forming excited species having a shorter lifetime than the lifetime of excited species formed from said first gas phase compound.

10. An apparatus for forming a chemically vapor deposited film according to claim 8, wherein said second gas phase compound is a compound which is more reactive than said first gas phase compound or capable of forming excited species having a shorter lifetime than the lifetime of excited species formed from said first gas phase compound.

* * * * *

UNITED STATES PATENT AND TRADEMARK OFFICE
CERTIFICATE OF CORRECTION

PATENT NO. : 5,803,974
DATED : September 8, 1998
INVENTOR(S) : NOBUO MIKOSHIBA ET AL.

It is certified that error appears in the above-identified patent and that said Letters Patent is hereby corrected as shown below:

Title Page, Item

[30] Priority, insert
"[30] Foreign Application Data
Sep. 26, 1985 [JP] Japan ....... -211144".
  [56] U.S. Patent Documents, insert
"4,505,949 3/1985 Jelks .......... 427/53.1
4,624,736 11/1986 Gee, et. at. ... 427/54.1"

COLUMN 1

Line 48, "externally" should read --by externally--.
Line 51, "involved" should be deleted.
Line 65, "With" should read --With the--.

COLUMN 2

Line 50, "method," should read --methods,--.

COLUMN 4

Line 39, "photoenergizes" should read --photoenergizers--.
Line 54, "10-5" should read --$10^{-5}$--.
Line 56, "easily the formation" should read --easily in the formation--.
Line 59, "light with" should read --light width--.

UNITED STATES PATENT AND TRADEMARK OFFICE
CERTIFICATE OF CORRECTION

PATENT NO. : 5,803,974

DATED : September 8, 1998

INVENTOR(S) : NOBUO MIKOSHIBA ET AL.

It is certified that error appears in the above-identified patent and that said Letters Patent is hereby corrected as shown below:

COLUMN 5

Line 33, "controlling adequately" should read
--adequately controlling--.
Line 58, "fluoride,calcium" should read
--fluoride, calcium--.

COLUMN 6

Line 14, "coil" should read --the coil--.
Line 61, "with" should read --which-- and "maintain"
should read --maintains--.

COLUMN 7

Line 6, "evacuate internally" should read
--internally evacuate--.
Line 23, "be" should be deleted.
Line 29, "its the" should read --its--.
Line 38, "be also" should read --also be--.
Line 58, "a example" should read --an example--.

COLUMN 8

Line 11, "or a" (first occurence) should read --or an--.

UNITED STATES PATENT AND TRADEMARK OFFICE
CERTIFICATE OF CORRECTION

PATENT NO. : 5,803,974

DATED : September 8, 1998

INVENTOR(S) : NOBUO MIKOSHIBA ET AL.

It is certified that error appears in the above-identified patent and that said Letters Patent is hereby corrected as shown below:

COLUMN 10

Line 63, "be sometimes" should read --sometimes be--.

COLUMN 12

Line 5, "formula a" should read --formula--.
    Line 6, "Mo" should read --a Mo--.
    Line 45, "dilute" should read --diluted--.

COLUMN 13

Line 12, "5," should read --5--.

COLUMN 14

Line 13, "long" should read --a long--.
    Line 27, "show" should read --shown--.

COLUMN 15

Line 6, "In" should read --in--.

COLUMN 16

Line 10, "caoted" should read --coated--.
    Line 53, "constitution" should read --construction--.

UNITED STATES PATENT AND TRADEMARK OFFICE
CERTIFICATE OF CORRECTION

PATENT NO. : 5,803,974

DATED : September 8, 1998

INVENTOR(S) : NOBUO MIKOSHIBA ET AL.

It is certified that error appears in the above-identified patent and that said Letters Patent is hereby corrected as shown below:

COLUMN 17

Line 20, "be also" should read --also be--.
Line 23, "(hereianfter" should read --(hereinafter--.

COLUMN 18

Line 59, "aobut" should read --about--.

COLUMN 19

Line 17, "or a" should read --or an--.
Line 25-26, "or a" should read --or an--.
Line 44, "absense" should read --absence--.
Line 52, "surface are" should read --surface, is--.

COLUMN 20

Line 13, "form" should read --from--.
Line 42, "source," should read --source;-- and "lamp" should read --a lamp--.

Line 43, "lamp," should read --a lamp,--.
Line 47, "(e.g." should read --(e.g.,--.
Line 56, "inles" should read --inlets--.
Line 66, "newly" should read --is newly--.

UNITED STATES PATENT AND TRADEMARK OFFICE
CERTIFICATE OF CORRECTION

PATENT NO. : 5,803,974

DATED : September 8, 1998

INVENTOR(S) : NOBUO MIKOSHIBA ET AL.

It is certified that error appears in the above-identified patent and that said Letters Patent is hereby corrected as shown below:

COLUMN 22

Line 41, "substarte" should read --substrate--.

Signed and Sealed this

Ninth Day of May, 2000

Attest:

Attesting Officer

Q. TODD DICKINSON

Director of Patents and Trademarks